(12) United States Patent
Nawata et al.

(10) Patent No.: US 6,444,087 B2
(45) Date of Patent: Sep. 3, 2002

(54) PLASMA ETCHING SYSTEM

(75) Inventors: Makoto Nawata; Mamoru Yakushiji; Tomoyuki Tamura, all of Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/866,702

(22) Filed: May 30, 2001

Related U.S. Application Data

(63) Continuation of application No. 09/487,303, filed on Jan. 19, 2000, now abandoned.

(30) Foreign Application Priority Data

Jan. 20, 1999 (JP) .......................................... 11-011471

(51) Int. Cl.$^7$ .......................... H05H 1/00; C23C 16/00
(52) U.S. Cl. .......................... 156/345.41; 156/345.42; 156/345.51; 118/723 MW; 118/723 MA; 118/728; 118/723 E
(58) Field of Search ...................... 156/345.41, 345.51, 156/345.36, 345.42; 118/723 MW, 723 MA, 723 E, 723 ME, 723 MR, 728

(56) References Cited

U.S. PATENT DOCUMENTS

| | | | |
|---|---|---|---|
| 5,362,358 A | 11/1994 | Yamagata et al. | 156/643 |
| 5,646,489 A | 7/1997 | Kakehi et al. | 315/111.21 |
| 5,874,705 A | 2/1999 | Duan | 219/121.43 |
| 5,904,778 A | 5/1999 | Lu et al. | 118/723 R |
| 5,998,932 A * | 12/1999 | Lenz | 315/111.21 |
| 6,095,084 A | 8/2000 | Shamoilian et al. | 118/723 E |
| 6,178,919 B1 * | 1/2001 | Li et al. | 118/723 E |

* cited by examiner

Primary Examiner—Gregory Mills
Assistant Examiner—P. Hassanzadeh
(74) Attorney, Agent, or Firm—Antonelli, Terry, Stout & Kraus, LLP

(57) ABSTRACT

A plasma etching system using a ground electrode made of silicon carbide and a cover made of a dielectric material not containing aluminum, where the cover is laid over the substrate electrode, thereby preventing aluminum from being produced out of these parts and reducing device damage. Namely, a plasma etching system has a substrate electrode mounted in a vacuum process chamber, a ground electrode and a plasma generating source, and uses plasma to provide etching of substrates mounted on said substrate electrode. The plasma etching system is characterized in that the ground electrode is made of carbon or silicon carbide, and the dielectric material containing a Si compound covers the surface portion of the substrate electrode facing inside the substrate installation portion of the vacuum process chamber, except for the substrate installation portion.

16 Claims, 6 Drawing Sheets

PLASMA ETCHING SYSTEM

This application is a Continuation application of Ser. No. 09/487,303, filed Jan. 19, 2000 now abandoned.

BACKGROUND OF THE INVENTION

The present invention relates to a plasma etching system using a plasma for etching of substrates mounted on a substrate electrode. More specifically, this invention relates to a plasma etching system which uses chlorine gas ($Cl_2$) alone or hydrogen bromide gas (HBr) alone, or a mixture of chlorine gas ($Cl_2$) and oxygen gas ($O_2$) or of hydrogen bromide gas (HBr) and oxygen gas ($O_2$) as an etching gas to provide silicon etching.

A microwave plasma etching system, for example, is known which uses chlorine gas ($Cl_2$) alone or hydrogen bromide gas (HBr) alone, or a mixture of chlorine gas ($Cl_2$) and oxygen gas ($O_2$) or of hydrogen bromide gas (HBr) and oxygen gas ($O_2$) as an etching gas to provide silicon etching.

To prevent substrates from being contaminated by iron (Fe), chromium (Cr) and nickel (Ni), a microwave plasma etching system uses aluminum as the material of the electrode having a ground potential (ground electrode), in place of the material containing these impurities. To prevent the electrode from being damaged or worn by a chlorine gas ($Cl_2$) plasma or hydrogen bromide gas (HBr) plasma, the surface of the aluminum (Al) is further treated with anode oxidation (aluminized treatment). To prevent the substrate electrode from being damaged or worn, the substrate electrode, except for the substrate installation portion, is covered with aluminum oxide (alumina), which acts as a dielectric material.

Prior plasma etching systems do not take into account the metallic contamination by aluminum (Al) generated out of the components of the etching process chamber. Metallic contamination of substrates by aluminum (Al) resulting from etching has occurred in recent highly integrated devices, especially the devices containing minute gates, thereby causing the interface state to be increased.

SUMMARY OF THE INVENTION

An object of the present invention is to provide a plasma etching system in which it is possible to avoid metallic contamination by aluminum (Al) as well as metallic contamination by iron (Fe), chromium (Cr) and nickel (Ni), and to suppress device damage.

Aluminum (Al) contamination has been found to be caused by a ground electrode made of aluminum (Al) and the cover (alumina) laid over the substrate electrode, according to an analysis made by the present inventors, namely, according to an evaluation of metallic contamination using total reflection X-ray fluorescence spectrometry.

This shows that the object of the present invention can be achieved by using a ground electrode made of silicon carbide and a cover made of a dielectric material that does not contain aluminum (Al) where the cover is laid over the substrate electrode. This prevents aluminum (Al) from being produced out of these parts.

The present invention is characterized by a plasma etching system comprising a substrate electrode mounted in a vacuum process chamber, a ground electrode and a plasma generating source, wherein plasma is used to provide etching of substrates mounted on the substrate electrode. In accordance with the invention, the ground electrode is made of carbon or silicon carbide, and a dielectric material containing a Si compound covers the surface portion of the substrate electrode facing inside the substrate installation portion of the vacuum process chamber, except for the substrate installation portion itself.

The present invention prevents metallic impurities (Fe, Cr, Ni and Al) from being generated out of the components of the etching process chamber, thereby reducing device damage.

DETAILED DESCRIPTION OF PREFERRED EMBODIMENTS

One embodiment of the present invention will be described with reference to FIGS. 1 and 2.

Figure 1:
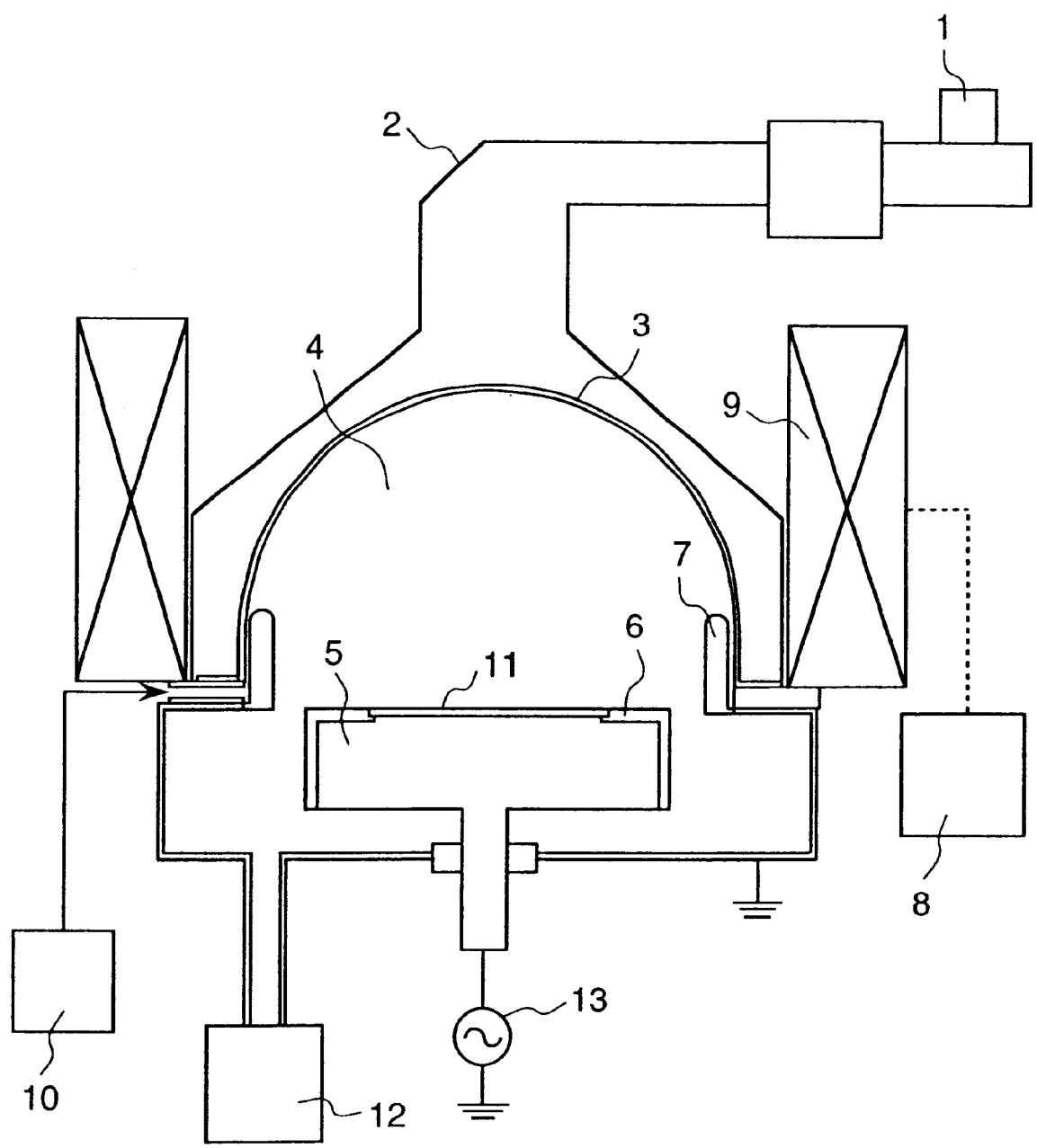
FIG. 1 is a vertical cross sectional view of a microwave plasma etching system representing one embodiment of the present invention.
Figure 2:
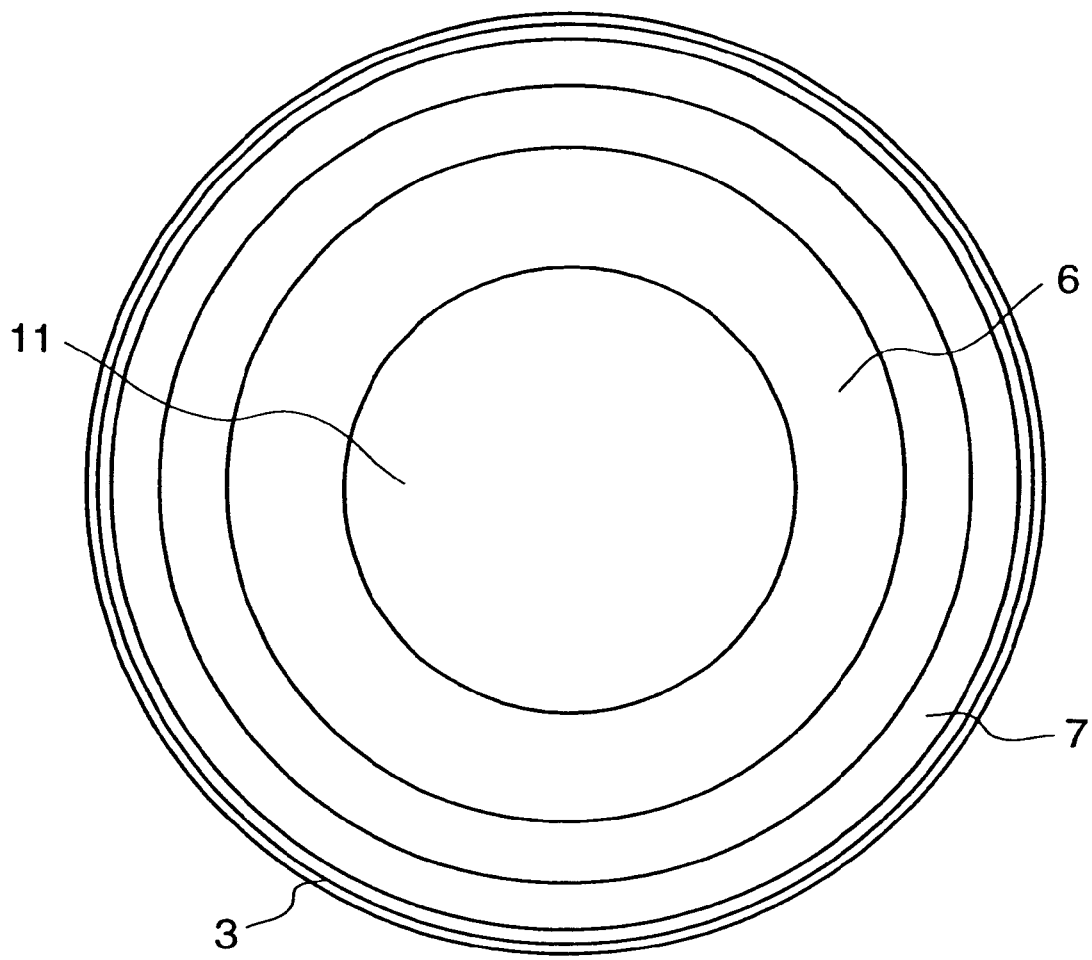
FIG. 2 is a transverse sectional view of the etching process chamber in FIG. 1.

FIG. 1 is a cross sectional view of a microwave plasma etching system, while FIG. 2 is a transverse sectional view of the etching process chamber in FIG. 1.

Microwaves generated by magnetron 1 are transferred to waveguide 2 and launched into etching process chamber 4 through bell jar 3. The etching process chamber 4 comprises the quartz bell jar 3, a substrate electrode 5, a quartz-made electrode cover 6 and silicon carbide-made ground electrode 7. The electrode portion of the substrate electrode 5 is made of a material containing aluminum. The etching process chamber 4 incorporates a magnetic field generating DC power supply 8, a solenoid coil 9 and a gas supply unit 10.

Gas fed to the etching process chamber 4 from the gas supply unit 10 is turned into a plasma by the electric field formed by the microwave (electric field) and the magnetic field formed by the direct current supplied to the solenoid coil 9 from the magnetic field generating DC power supply 8. A substrate 11 is etched by the plasma. The etching pressure is controlled by a vacuum exhaust unit 12. The energy of the ions incident on the substrate 11 is controlled by the radio-frequency power supplied to the substrate electrode 5 from a radio-frequency power source 13.

Figure 3:
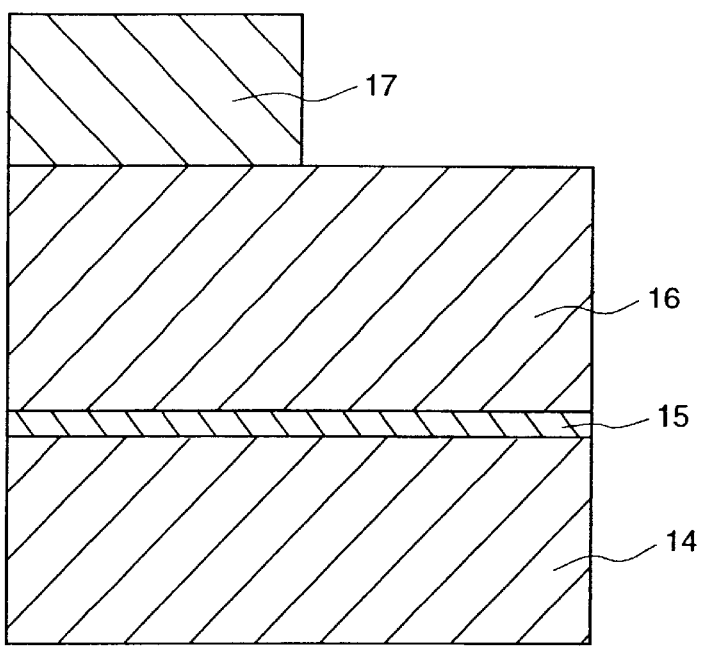
FIG. 3 is a cross sectional view of a substrate immediately before etching by the system in FIG. 1.

FIG. 3 is a cross sectional view of a substrate immediately before etching by the system in FIG. 1. The substrate 11 has an oxide film 15 and a polycrystalline silicon layer 16 formed on the silicon substrate 14, and mask 17 is patterned on the polycrystalline silicon layer 16. A mixture of $Cl_2$ and $O_2$ is used as the etching gas. The etching gas is turned into a plasma by the magnetic field and microwave electric field, and the polycrystalline silicon layer 16 of the substrate 11 mounted on the substrate electrode 5 is etched by ions and radicals in the plasma. In this case, the energy of the ions in the plasma incident on the substrate 11 is controlled by radio-frequency power having a frequency of 800 supplied from the radio-frequency power source 13.

Figure 4:
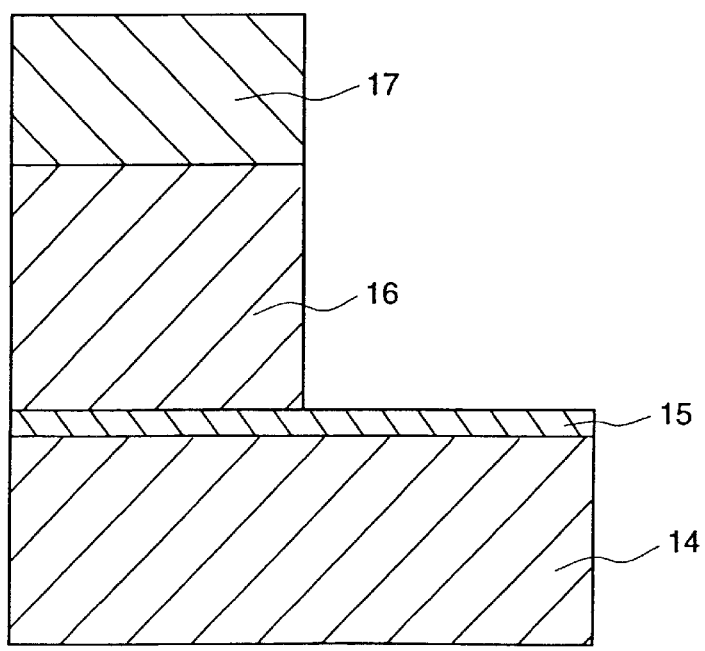
FIG. 4 is a cross sectional view of a substrate immediately after etching by the system in FIG. 1.

FIG. 4 is a cross sectional view of a substrate immediately after etching. When the oxide film 15 is etched upon completion of etching of the polycrystalline silicon layer 16, the incident energy of ions in the plasma is reduced by decreasing the radio-frequency power supplied from the radio-frequency power source 13 in order to control the yield of the etching of the oxide film 15.

The present invention uses the quartz-made electrode cover 6 and the silicon carbide-made ground electrode 7 to ensure that iron (Fe), chromium (Cr), nickel (Ni) and aluminum (Al) as metallic impurities of the substrate are not generated from the electrode cover 6 and ground electrode 7 at the time of etching.

As disclosed above, the present invention prevents metallic impurities (Fe, Cr, Ni and Al) from being generated out of the components of the etching process chamber.

Another embodiment of the present invention will be described.

Similarly to the previous embodiment, this embodiment uses the microwave plasma etching system shown in FIGS. 1 and 2 to etch the polycrystalline silicon gate structure. The substrate 11 before etching has an oxide film 15 and polycrystalline silicon layer 16 formed on the silicon substrate 14, as shown in the cross sectional view of FIG. 3. The mask 17 is patterned on the polycrystalline silicon layer 16. A mixture of HBr and $O_2$ is used as the etching gas, and the etching gas is turned into a plasma by the magnetic field and microwave electric field. The polycrystalline silicon layer 16 of the substrate 11 is etched by ions and radicals in the plasma. In this case, the energy of the ions in the plasma incident on the substrate 11 is controlled by the 800 kHz radio-frequency power supplied from the radio-frequency power source 13.

FIG. 4 is a cross sectional view of the substrate 11 immediately after etching. In order to control the yield of etching of the oxide film 15 upon completion of etching of the polycrystalline silicon layer 16, the energy of incident ions in the plasma is reduced by decreasing the radio-frequency power supplied from the radio-frequency power source 13. The quartz-made electrode cover 6 and the silicon carbide-made ground electrode 7 are used to ensure that iron (Fe), chromium (Cr) or nickel (Ni) and aluminum (Al) as metallic impurities are not generated from the electrode cover 6 and ground electrode 7 at the time of etching.

As disclosed above, the present invention prevents metallic impurities (Fe, Cr, Ni and Al) from being generated out of the components of the etching process chamber.

Still another embodiment of the present invention will be described with reference to FIG. 5 and FIG. 6.

Figure 5:
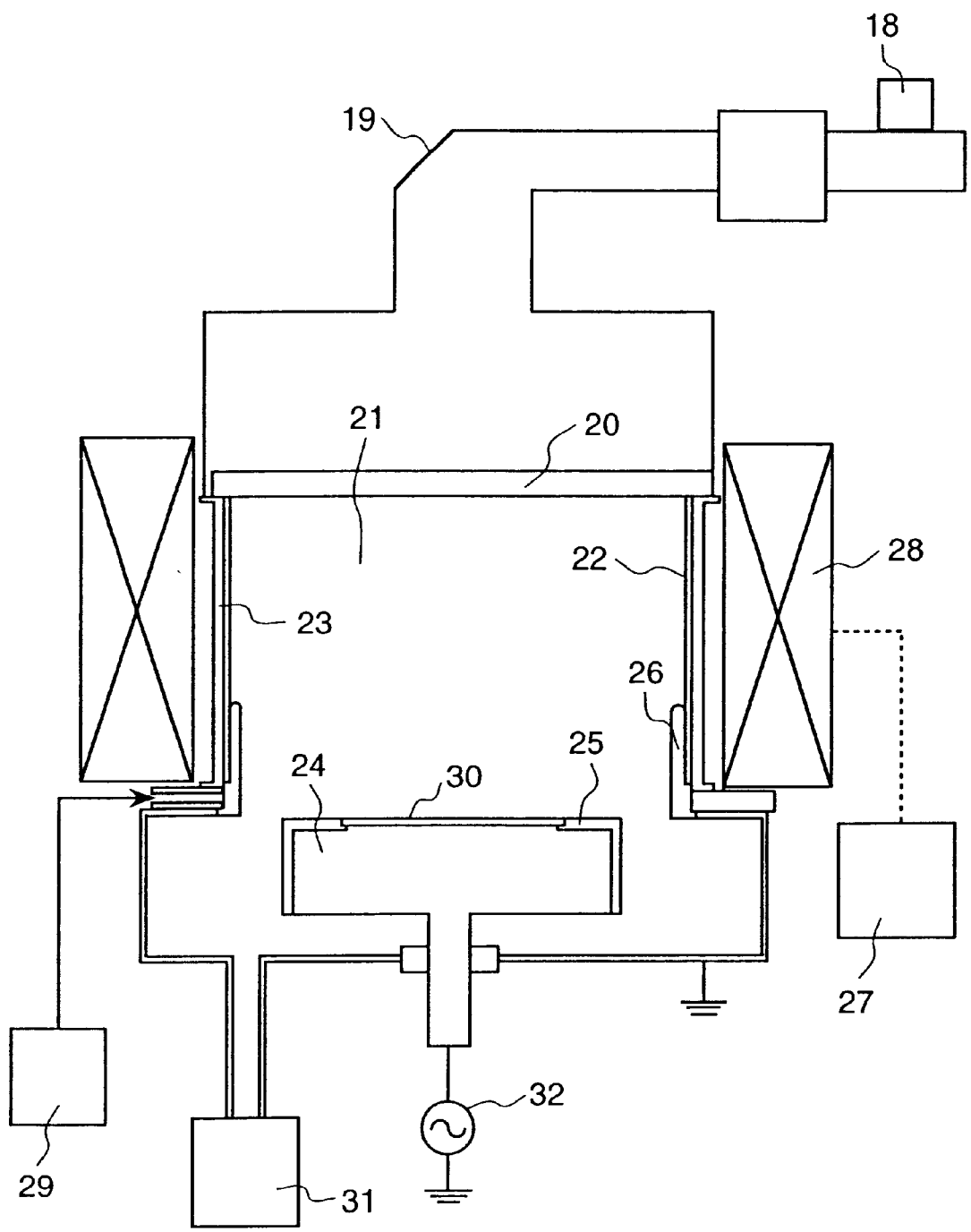
FIG. 5 is a vertical cross sectional view of a microwave plasma etching system representing another embodiment of the present invention.
Figure 6:
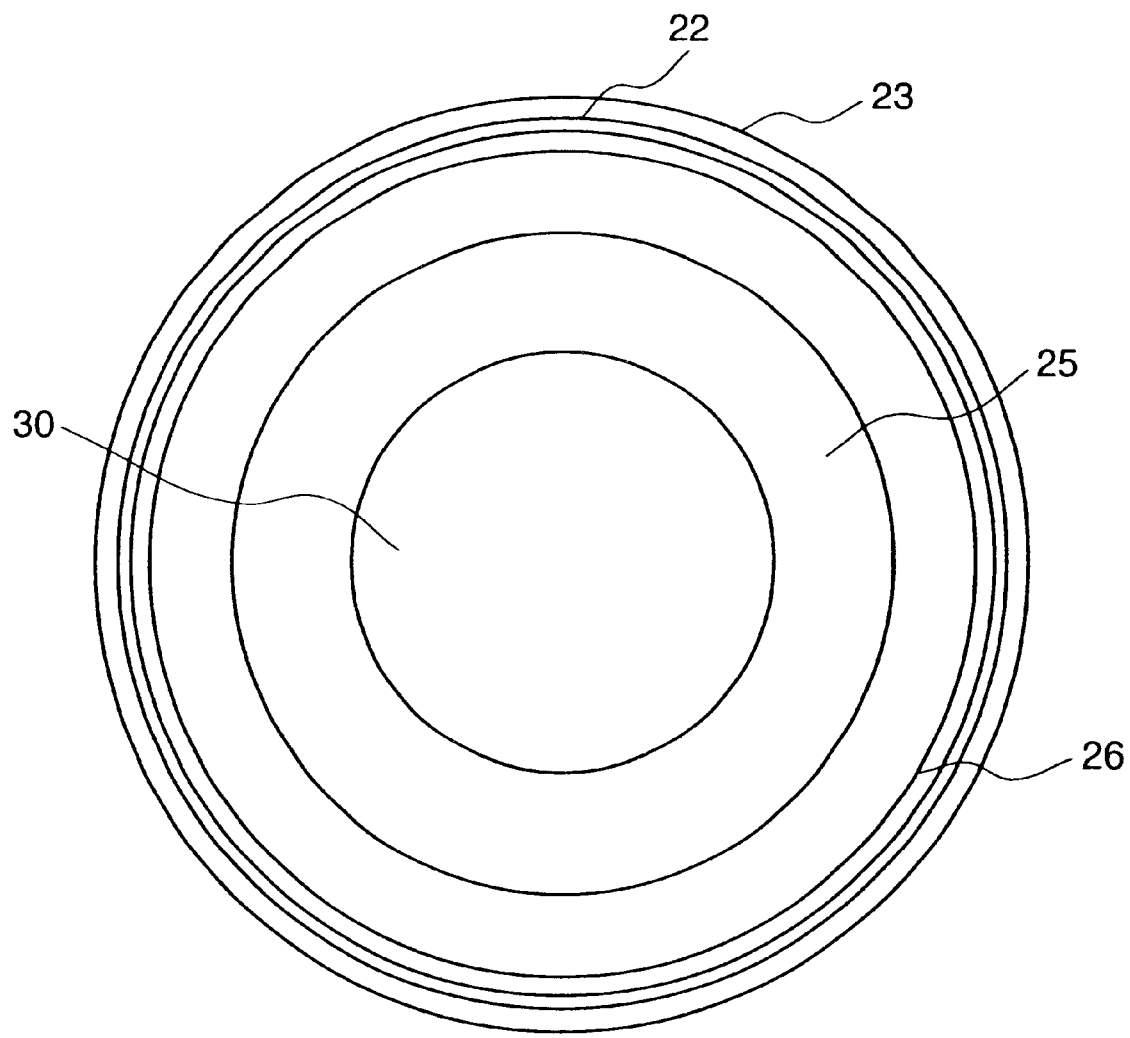
FIG. 6 is a transverse sectional view of the etching process chamber in FIG. 5.

FIG. 5 is a cross sectional view of a microwave plasma etching system. FIG. 6 is a transverse sectional view of the etching process chamber in FIG. 5.

Microwaves generated by the magnetron 18 are transferred to waveguide 19 and launched into the etching process chamber 21 through quartz-made window 20. The etching process chamber 21 is composed of a quartz-made inner cylinder 22, an aluminum-made vacuum vessel 23, a substrate electrode 24, the quartz-made electrode cover 25 and the silicon carbide-made ground electrode 26. Gas fed from the gas supply unit 29 is turned into a plasma by a microwave electric field and a magnetic field formed by the direct current supplied to the solenoid coil 28 from the DC power supply 27. Substrate 30 is etched by the plasma, and the pressure during etching is controlled by the vacuum exhaust unit 31. The energy of the ions incident on the substrate 30 is controlled by the radio-frequency power applied to the substrate electrode 24 from the radio-frequency power source 32.

Etching of the substrate 30 is carried out using the same steps as those for the above disclosed embodiment. The etching process chamber is composed of a quartz-made inner cylinder 25 and a silicon carbide-made ground electrode 26 to ensure that iron (Fe), chromium (Cr) or nickel (Ni) and aluminum (Al) as metallic impurities are not generated from the electrode cover 25 and ground electrode 27 at the time of etching.

These measures according to the present invention avoid contamination by metals (Fe, Cr, Ni and Al) coming out of the components of the etching process chamber.

The above embodiment has been used to explain the effect of using a quartz-made electrode cover. The same effect can be obtained when a silicon nitride cover is used.

Figure 7:
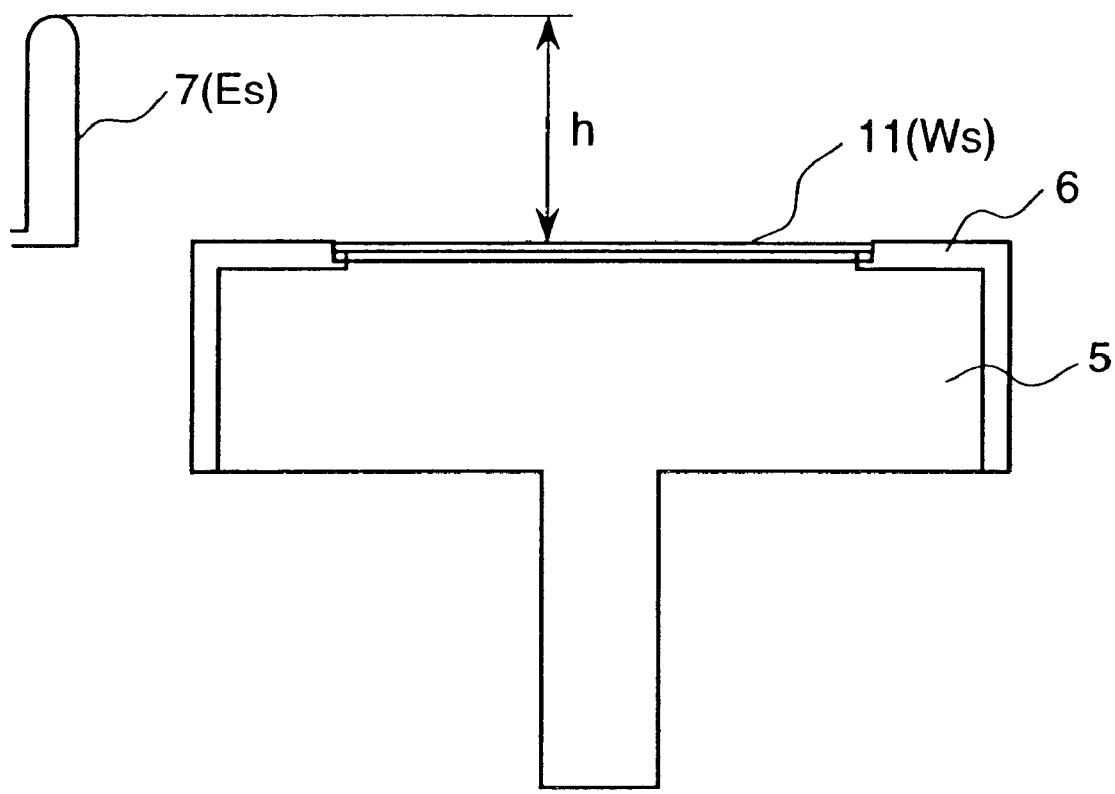
FIG. 7 is a diagram showing the relationship between the ground electrode and substrate installation surface of the substrate electrode in accordance with the present invention.

To control the energy of ions incident on the substrate, it is preferred that the ground electrode is clearly visible from the substrate electrode; in other words, the ground electrode preferably should have a sufficient area. As shown in FIG. 7, it is preferred to meet the conditions of Es/Ws>2, where the substrate area is Ws, and the ground electrode area is Es. If the substrate area Ws is increased, the preferred ground electrode area must be increased accordingly. From the view point of the ground area, there is no upper limit to the ratio Es/Ws, but the ratio Es/Ws is limited by other structural restrictions of the etching process chamber.

As shown in FIG. 7, the bottom end face of the ground electrode is preferably almost as high as the substrate installation surface of the substrate electrode, or extended slightly below the installation surface. By way of example, the height of the ground electrode h is about 45 to 70 mm. The ground electrode as a whole preferably constitutes a part of the inner wall of the vacuum process chamber at the inclined upward position on the outside in the radial direction of the substrate installation surface of the substrate electrode.

Radio-frequency power supplied to the substrate electrode described with reference to this embodiment is preferably not to exceed 2 MHz, or is more preferably within the range from 400 to 800 kHz. The same effect can be obtained even when time modulation bias is applied to this radio-frequency (13, 32).

The effect of the microwave plasma etching system has been described with reference to this embodiment. The same effect can also be gained according to other discharging methods, for example, Helicon Type and TCP (Transform Coupled Plasma) methods.

As disclosed above, the present invention prevents metallic impurities (Fe, Cr, Ni and Al) from being generated out of the components of the etching process chamber, thereby suppressing device damage.

What is claimed is:

1. A microwave plasma etching system comprising a substrate electrode mounted in a vacuum process chamber, a ground electrode and a plasma generating source for turning an etching gas into a plasma by an electric field formed by a microwave and a magnetic field, wherein said plasma is used for plasma etching of substrates mounted on said substrate electrode;

said plasma etching system being characterized in that said ground electrode is made of carbon or silicon carbide, a dielectric material containing a Si compound covers the surface portion of said substrate electrode facing inside the substrate installation portion of said vacuum process chamber except for the substrate installation portion, and, when a substrate installation surface of the substrate electrode is horizontal, a bottom end face of said ground electrode is substantially at a same level of said substrate installation surface or extends slightly below said substrate installation surface so that said ground electrode constitutes a part of an inner wall of said vacuum process chamber at an inclined upward position outside, in the radial direction, of said substrate installation surface.

2. A microwave plasma etching system according to claim 1, wherein the electric resistance of the material of said ground electrode does not exceed $10^4$ Ω·cm.

3. A microwave plasma etching system according to claim 1, wherein said dielectric material is quartz or silicon nitride.

4. A microwave plasma etching system according to claim 1, wherein said substrate electrode is supplied with 100 kHz to 2 MHz by a radio-frequency power source.

5. A microwave plasma etching system according to claim 4, wherein said radio-frequency power is configured to undergo time modulation.

6. A microwave plasma etching system according to claim 1, wherein the area of said ground electrode is increased in conformity to the area of said substrate.

7. A microwave plasma etching system according to claim 6, wherein the ratio between said ground electrode area and substrate area is 2 or more.

8. A microwave plasma etching system comprising a substrate electrode mounted in a vacuum process chamber, a ground electrode and a plasma generation source for turning an etching gas into a plasma by an electric field formed by a microwave and a magnetic field, wherein said plasma is used for plasma etching of substrates mounted on said substrate electrode;

said plasma etching system being characterized in that said ground electrode has a bottom end face, and the bottom end face of said ground electrode, when a substrate installation surface of the substrate electrode is horizontal, is substantially at a same level of said substrate installation surface or extends slightly below said substrate installation surface so that said ground electrode constitutes a part of the inner wall of said vacuum process chamber at an inclined upward position on the outside in the radial direction of the substrate installation surface of said substrate electrode, wherein said ground electrode is made of carbon or silicon carbide, and the surface of said substrate electrode corresponding to said ground electrode is covered with a dielectric material containing a Si compound.

9. A microwave plasma etching system according to claim 8, wherein the electrode resistance of the material of said ground electrode does not exceed $10^4$ Ω·cm.

10. A microwave plasma etching system according to claim 8, wherein said dielectric material is quartz or silicon nitride.

11. A microwave plasma etching system according to claim 8, wherein said substrate electrode is supplied with 100 kHz to 2 MHz by a radio-frequency power source.

12. A microwave plasma etching system according to claim 11, wherein said radio-frequency power is configured to undergo time modulation.

13. A microwave plasma etching system according to claim 8, wherein the area of said ground electrode is increased in conformity to the area of said substrate.

14. A microwave plasma etching system according to claim 13, wherein the ratio between said ground electrode area and substrate area is 2 or more.

15. A microwave plasma etching system comprising a substrate electrode mounted in a vacuum process chamber, a ground electrode and a plasma generating source for turning an etching gas into a plasma by an electric field formed by a microwave and a magnetic field, wherein chlorine gas or a mixture of chlorine gas and oxygen gas is used as an etching gas to provide etching of silicon substrate mounted on said substrate electrode at a gas pressure of 3 Pa or less;

said plasma etching system being characterized in that when a substrate installation surface of the substrate electrode is horizontal, a bottom end face of said ground electrode is substantially at a same level of said substrate installation surface or extends slightly below said substrate installation surface so that said ground electrode constitutes a part of an inner wall of said vacuum process chamber at an inclined upward position outside, in the radial direction, of said substrate installation surface, and said ground electrode is made of carbon or silicon carbide, and dielectric material containing a Si compound covers the surface portion of said substrate electrode facing inside the substrate installation portion of said vacuum process chamber, except for the substrate installation portion.

16. A microwave plasma etching system comprising a substrate electrode mounted in a vacuum process chamber, a ground electrode and a plasma generating source for turning an etching gas into a plasma by an electric field formed by a microwave and a magnetic field, wherein hydrogen bromide gas or a mixture of hydrogen bromide gas and oxygen gas is used as said etching gas to provide plasma etching of silicon substrates mounted on said substrate electrode at a gas pressure of 3 Pa or less;

said plasma etching system being characterized in that when a substrate installation surface of the substrate electrode is horizontal, a bottom end face of said ground electrode is substantially at a same level of said substrate installation surface or extends slightly below said substrate installation surface so that said ground electrode constitutes a part of an inner wall of said vacuum process chamber at an inclined upward position outside, in the radial direction, of said substrate installation surface, and said ground electrode is made of carbon or silicon carbide, and dielectric material containing a Si compound covers the surface portion of said substrate electrode facing inside the substrate installation portion of said vacuum process chamber, except for the substrate installation portion.

\* \* \* \* \*